United States Patent [19]

Graff et al.

[11] Patent Number: 5,371,040
[45] Date of Patent: Dec. 6, 1994

[54] METHOD FOR MANUFACTURING SEMICONDUCTOR COMPONENTS WITH SHORT SWITCHING TIME

[75] Inventors: Klaus Graff, Heilbronn; Werner Zurek, Lauffen, both of Germany

[73] Assignee: Temic Telefunken microelectronic GmbH, Heilbronn, Germany

[21] Appl. No.: 132,912

[22] Filed: Oct. 7, 1993

[30] Foreign Application Priority Data

Oct. 28, 1992 [DE] Germany .............. 4236300

[51] Int. Cl.⁵ .............................. H01L 21/22
[52] U.S. Cl. ............................ 437/142; 437/12; 148/DIG. 23
[58] Field of Search ............ 437/12, 142, 959; 257/608, 610, 611, 612; 148/DIG. 23, DIG. 40, DIG. 62

[56] References Cited

U.S. PATENT DOCUMENTS

| 4,009,484 | 2/1977 | Ogiue et al. ........... 257/610 |
| 4,963,509 | 10/1990 | Yoshizawa et al. ......... 437/142 |

FOREIGN PATENT DOCUMENTS

| 0277336A1 | 8/1988 | European Pat. Off. . |
| 1961739 | 6/1970 | Germany . |
| 2735769 | 2/1979 | Germany . |
| 3328521A1 | 2/1985 | Germany . |
| 3435464A1 | 4/1986 | Germany . |
| 3823795C2 | 1/1990 | Germany . |
| 3832748A1 | 3/1990 | Germany . |
| 3913123A1 | 10/1990 | Germany . |
| 56-114367 | 9/1981 | Japan ................. 437/142 |
| 2-51236 | 2/1990 | Japan ................. 437/142 |

OTHER PUBLICATIONS

Usami, Akira et al.: Spectral Responses of GaAs Photodiodes Fabricated by Rapid Thermal Diffusion. In: IEEE Electron Device Letters, vol. 13, No. 1, Jan., 1992 pp. 59–60.

Seidel, T. E.; et. al.: Rapid Thermal annealing of dopants implanted into preamorphized silicon, In: J. Appl. Phys. 58 (2), Jul. 15th, 1985, pp. 683–687.

Schlangenotto, Heinrich et al.: Halbleiter-Leistungs-bauelemente: Untersuchungen zur Physik und Technologie. In: Wiss. Ber. AEG Telefunken, 55, 1982, 1-2, pp. 7–24.

Crowder, B. L. et al.: Silicon Schottky Barrier Bistable Memory Element. In: IBM Technical Disclosure Bulletin, vol. 15, No. 3, Aug. 1972, p. 891.

Primary Examiner—Brian E. Hearn
Assistant Examiner—Chandra Chaudhari
Attorney, Agent, or Firm—Spencer, Frank & Schneider

[57] ABSTRACT

A method is described for manufacturing semiconductor components with short switching time, having a weakly doped semiconductor area in contact with a PN junction. In order to obtain an inhomogeneous impurity distribution in the axial direction of the semiconductor array, the following process steps are implemented:

a) gold impurities are placed in the semiconductor array and homogeneously distributed there in a first diffusion process, b) a layer comprising a 3d transition metal affecting the charge carrier lifetime is deposited onto that surface side of the semiconductor array having a shorter distance from the weakly doped semiconductor area, c) the 3d transition metal is incorporated into the semiconductor array by a second diffusion process and is inhomogeneously distributed there, such that an impurity surplus is generated in a partial area of the weakly doped semiconductor area in the vicinity of the PN junction.

6 Claims, 1 Drawing Sheet

METHOD FOR MANUFACTURING SEMICONDUCTOR COMPONENTS WITH SHORT SWITCHING TIME

DESCRIPTION OF THE PRIOR ART

In semiconductor components, the switching time and the switching behavior are determined by the lifetime of the charge carriers; in fast semiconductor components in particular, both a short switching time (low forward voltage) and a good switching behavior (small reverse current peak and soft-recovery behavior) are of interest. To set the charge carrier lifetime or switching time, impurities are selectively placed in the semiconductor array, and the impurity profile should be as inhomogeneous as possible in order to improve the component's properties. Standard diffusion processes with heavy metals do however have the drawback that a fairly homogeneous concentration distribution of the impurities results.

SUMMARY OF THE INVENTION

The object underlying the invention is to provide a method in accordance with the preamble of claim 1, whereby the required charge carrier lifetime profile can be selectively set, and in particular the charge carrier lifetime can be reduced to a particularly high degree in a partial area of the semiconductor array.

This object is attained in accordance with the invention by the features and characteristics of claim 1.

Advantageous embodiments of the invention are the subject of sub-claims.

The following process steps for manufacture of the semiconductor component are implemented in accordance with the invention:

first, a homogeneous gold diffusion process is carried out for homogeneous placing of impurities in the semiconductor array, where the concentration of gold impurities—which is adjustable using the diffusion temperature—can be relatively low then a layer of a medium-fast-diffusing 3d transition metal affecting the charge carrier lifetime is deposited (for example by sputtering) onto that side of the semiconductor array having a shorter distance from the weakly doped semiconductor area by an inhomogeneous short-term diffusion process— for example a rapid thermal annealing process (RTA)—the 3d transition metal is provided in the necessary concentration at the required point, i.e. in a partial area of the weakly doped semiconductor area, and hence an inhomogeneous distribution of the impurities or an axial impurity profile is obtained in the semiconductor array by a subsequent tempering process, the impurity complexes thus formed can be retroactively influenced such that the concentration distribution of the impurities can be variably adjusted.

The method in accordance with the invention combines a number of advantages:

the diffusion behavior of the additive and lifetime-affecting impurities in the second diffusion process is controllable, so that the lifetime of the charge carriers can be selectively reduced at the required point a very effective inhomogeneous impurity profile—in conjunction with optimized component properties (switch-off operation/on-state power losses)—can be selectively adjusted the homogeneously distributed gold impurities still present in the semiconductor array have the effect that the reverse current does not die away too slowly when the semiconductor component is switched off in the highly doped surface area, the high concentration of additive impurities is not a big problem, since it is the weakly doped semiconductor area which is crucial for the component properties.

DESCRIPTION OF THE DRAWINGS

The process is described in further detail on the basis of an embodiment.

DESCRIPTION OF A PREFERRED EMBODIMENT

Figure 1:
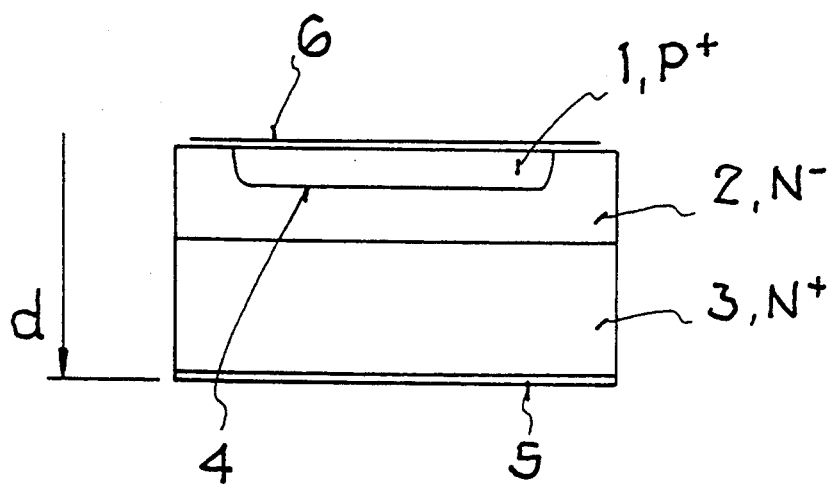
FIG. 1 shows a section through a semiconductor component, in which an axial impurity profile is to be set, and FIG. 2 the concentration distribution of the charge carriers and impurities.
Figure 2:
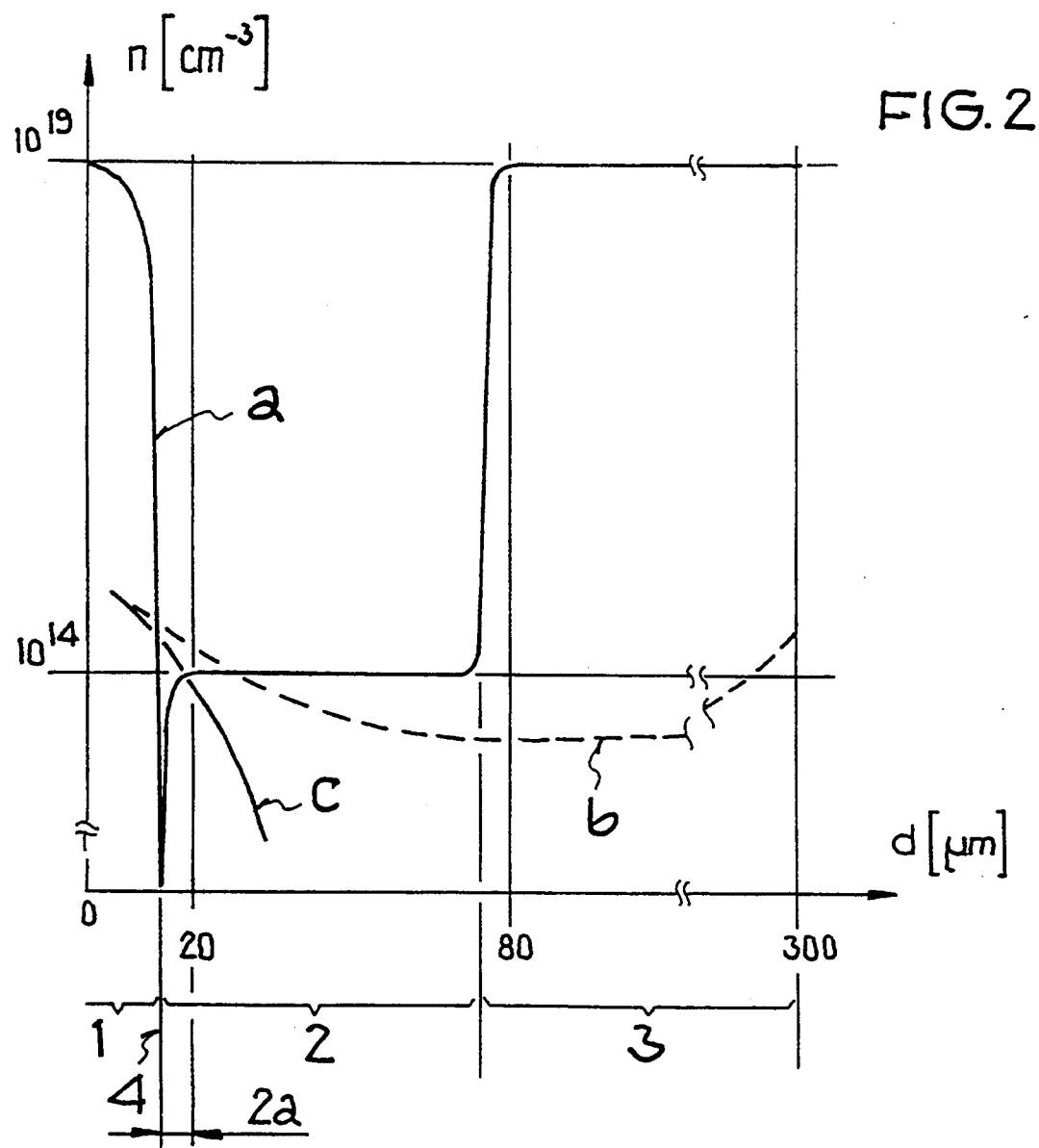

In accordance with the axial sectional view in FIG. 1, the semiconductor component—for example a diode with a blocking voltage of more than 1000 V—comprises the P+ layer 1, the N− layer 2 and the N+ layer 3, with a PN junction 4 being formed between the P+ layer 1 and the N− layer 2. After implementation of the doping diffusions—curve a in FIG. 2 shows the resultant doping profile—a gold layer 5 (for example 10 nm thick) is deposited (for example vapor-deposited) onto the surface of the N+ layer 3 and diffused into the semiconductor array (for example for 1 hour at 900° C.); in accordance with curve b, FIG. 2, this results in a fairly homogeneous, slightly U-shaped profile of the gold impurity concentration with a mean value of, for example, $10^{14}$ cm$^{-3}$. An iron layer 6 is then deposited (for example sputtered) onto the surface of the P+ layer 1 and diffused in using an RTA process at 950° C. for 10 seconds (the RTA process allows a steeply falling diffusion profile to be obtained in the semiconductor array). With the aid of a selectively controlled cooling phase at the end of the RTA process, it is possible to effect an almost total transformation of the iron atoms and gold atoms into iron/gold complexes that are very efficient recombination centers in silicon. The concentration of iron/-gold complexes—cf. curve c, FIG. 2—is around $2\times10^{14}$ cm$^{-3}$ with a penetration depth of 10 μm, for example, and drops steeply in the axial direction as the distance from the surface increases. Since the iron/gold complexes represent considerably stronger recombination centers than the gold impurities, they determine the charge carrier lifetime in the partial area 2a of the weakly doped N− area 2 and hence provide the required axial lifetime profile. Thanks to a tempering process at a temperature of, for example, 300° C., the iron/gold complexes are partially or completely dissociated, such that with this process a certain concentration of iron/gold pairs can be selectively adjusted and hence also the charge carrier lifetime. The further manufacturing steps, such as passivation, metallization and assembly, are implemented as standard processes. The process in accordance with the invention can be used in all semiconductor components having a short switching time and whose component properties are to be selectively adjusted; for example, components with several PN junctions may be mentioned in addition to the diode described.

What is claimed is:

1. A method for manufacturing semiconductor components with short switching time, having a weakly doped semiconductor area (2) in contact with a PN junction (4), wherein, in order to obtain an inhomogeneous impurity distribution in the axial direction of the semiconductor array a) gold impurities are placed in said semiconductor array and homogeneously distributed there in a first diffusion process,
b) a layer (6) comprising a 3d transition metal affecting the charge carrier lifetime is deposited onto that surface side of said semiconductor array having a shorter distance from said weakly doped semiconductor area (2),
c) said 3d transition metal is incorporated into said semiconductor array by a second diffusion process and is inhomogeneously distributed there, such that an impurity surplus is generated in a partial area (2a) of said weakly doped semiconductor area (2) in the vicinity of said PN junction (4).

2. A method according to claim 1, wherein said second diffusion process is implemented in the form of a rapid-thermal-annealing process.

3. A method according to claim 1, wherein the concentration of impurities is adjusted in a tempering process following said second diffusion process.

4. A method according to claim 3, wherein said tempering process is implemented at a temperature of 250° C. to 350° C.

5. A method according to claim 1, wherein iron is used as said 3d transition metal in said second diffusion process, and wherein iron/gold impurity pairs are formed in said process.

6. A method according to claim 1, wherein chrome is used as said 3d transition metal of said second diffusion process.

* * * * *